United States Patent
Hinz et al.

(10) Patent No.: US 7,358,723 B2
(45) Date of Patent: Apr. 15, 2008

(54) MAGNETORESISTIVE SENSOR

(75) Inventors: Michael Hinz, Hamburg (DE); Stefan Butzmann, Hagen (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/518,849

(22) PCT Filed: Jun. 19, 2003

(86) PCT No.: PCT/IB03/02901

§ 371 (c)(1),
(2), (4) Date: Jan. 23, 2006

(87) PCT Pub. No.: WO2004/003478

PCT Pub. Date: Jan. 8, 2004

(65) Prior Publication Data

US 2006/0164076 A1    Jul. 27, 2006

(30) Foreign Application Priority Data

Jun. 27, 2002 (DE) .............................. 102 28 662

(51) Int. Cl.
G01R 33/09 (2006.01)
G01R 33/02 (2006.01)
G01B 7/30 (2006.01)

(52) U.S. Cl. ................. 324/252; 324/249; 324/207.21; 324/207.25

(58) Field of Classification Search ........... 324/207.21, 324/252, 207.24–207.25, 249; 73/514.31, 73/514.39; 338/32 R, 32 H
See application file for complete search history.

(56) References Cited

U.S. PATENT DOCUMENTS 5,038,130 A * 8/1991 Eck et al. ................. 338/32 R
(Continued)

FOREIGN PATENT DOCUMENTS

DE    29 11 733 A1    10/1979
DE    3317594 A1      11/1984
WO    WO 00/29815 A1   5/2000

*Primary Examiner*—Bot LeDynh
(74) *Attorney, Agent, or Firm*—Peter Zawilski

(57) ABSTRACT

What is described is a magnetoresistive sensor for operation with a magnetized encoder, which is equipped with a zone with magnetic north and south poles arranged alternately along a direction of motion, comprising a Wheatstone bridge configuration with a first bridge arm between a first supply terminal and a first signal output terminal of the Wheatstone bridge configuration, a second bridge arm between the first supply terminal and a second signal output terminal of the Wheatstone bridge configuration, a third bridge arm between a second supply terminal and the first signal output terminal of the Wheatstone bridge configuration, and a fourth bridge arm between the second supply terminal and the second signal output terminal of the Wheatstone bridge configuration, wherein each of the bridge arms comprises an ohmic resistance element with a resistance-value dependence on the magnetic field strength of a magnetic field influencing the ohmic resistance element in accordance with a defined characteristic. For a further reduction in the spatial dimensions, the characteristics of the ohmic resistance elements in the first and fourth bridge arms are selected to be at least essentially matching with each other and significantly different from the characteristics, selected to be at least essentially matching with each other, of the ohmic resistance elements in the second and third bridge arms.

6 Claims, 5 Drawing Sheets

U.S. PATENT DOCUMENTS 5,744,950 A * 4/1998 Seefeldt .................... 324/166
5,877,705 A * 3/1999 Sampey .................... 340/933
5,982,171 A * 11/1999 Umemoto et al. ..... 324/207.21
2002/0171418 A1* 11/2002 Hinz et al. ............. 324/207.22

* cited by examiner

MAGNETORESISTIVE SENSOR

This application is a national stage filling under 35 U.S.C. 371 based on International Application No. PCT/IB03/02901, filed Jun. 19, 2003, which claims priority to German Application No. 102 28 662.0 filed Jun. 27, 2002, the content of which is incorporated herein by reference in its entierty.

The invention relates to a magnetoresistive sensor for operation with a magnetized encoder, which is equipped with a zone with magnetic north and south poles arranged alternately along a direction of motion, comprising a Wheatstone bridge configuration with a first bridge arm between a first supply terminal and a first signal output terminal of the Wheatstone bridge configuration, a second bridge arm between the first supply terminal and a second signal output terminal of the Wheatstone bridge configuration, a third bridge arm between a second supply terminal and the first signal output terminal of the Wheatstone bridge configuration, and a fourth bridge arm between the second supply terminal and the second signal output terminal of the Wheatstone bridge configuration, wherein each of the bridge arms comprises an ohmic resistance element with a resistance-value dependence on the magnetic field strength of a magnetic field influencing the ohmic resistance element in accordance with a defined characteristic. The invention further relates to a motion and/or speed measurement device with a said magnetized encoder. Sensors and motion and/or speed measurement devices of this kind are preferably provided in automotive construction for position measurement, speed measurement and recognition of the rotational direction of moving chassis and engine components.

A sensor of the type specified above is known from WO 00/29815. In this sensor, the ohmic resistance elements of the first and fourth bridge arms on the one hand, and those of the second and third bridge arms on the other are arranged so as to be interleaved in one another. The ohmic resistance elements of the four bridge arms are otherwise of identical design, i.e. have matching resistance values. The two interleaved configurations, designated "fields", are arranged with a spatial separation from each other that is matched to at least virtually half of one of the pole faces of an annular magnet. In accordance with WO 00/29815, an annular magnet of this kind is typically used for the speed measurement of vehicle wheels. Accordingly, the distance between the "fields" is calculated in such a way that one of the "fields" is located directly above the center of one of the pole faces of the annular magnet when the other of the pole faces is located above a boundary between two adjacent pole faces. Since this configuration brings about an output signal with a wave crest and a wave trough for each of the pole faces on the Wheatstone bridge configuration, an output pulse or a pulse period is emitted by the sensor for each of the pole faces. Compared with sensors designated conventional in accordance with WO 00/29815, with an output signal pulse for each pole pair covered, the annular magnet can thereby be reduced by half, wherein an unchanged number of output signal pulses are retained.

With an unchanged annular magnet, therefore, a doubling of the number of output signal pulses, i.e. a frequency doubling of the output signal of the Wheatstone bridge configuration, is achieved.

It is an object of the invention to create a magnetoresistive sensor for operation with a magnetized encoder, with a further reduction in the spatial dimensions.

This object is achieved in accordance with the invention in a magnetoresistive sensor of the type specified in the preamble of claim 1 in that the characteristics of the ohmic resistance elements in the first and fourth bridge arms are selected to be at least essentially matching with each other and significantly different from the characteristics, selected to be at least essentially matching with each other, of the ohmic resistance elements in the second and third bridge arms.

A sensor constructed in this way is extremely compact and, whilst retaining the frequency doubling of the output signal of the Wheatstone bridge configuration, enables a further reduction of the dimensions of a motion and/or speed measurement device thereby equipped.

The requirement to retain or improve the resolution of the output signal of motion and/or speed measurement devices, which derives from the scaling-down of mechanical components in the automotive field (e.g. wheel bearings) that will be aimed for in the future and the associated restriction of space availability, is already being fulfilled through the use of frequency doubling in the magnetoresistive sensor. With the aid of the invention, positions and speeds can be determined, wherein the frequency of the sensor output signal is doubled as compared with conventional sensors, without the use of additional electronic components.

It should be noted at this point that a magnetic field sensor is known from DE 33 17594 A1, which comprises two series-connected sensor elements, which, with two resistance elements, form a Wheatstone bridge circuit. The sensor elements are equipped with parallel current paths of magnetoresistive material, which are magnetized in the same direction without exposure to a magnetic field. When exposed to a magnetic field, the ohmic resistance values of the sensor elements change in the same direction, so the voltage measured in the dead arm of the Wheatstone bridge is a measure of the value of the magnetic field gradient.

It should further be noted that a magnetic field sensor is known from DE-OS 2911733, which is equipped with two sensor elements with primary-current carrying paths comprising magnetoresistive material, which are arranged at right angles to one another and supplied with bias fields extending towards one another in the same direction and at an angle of 45° in relation to each primary-current carrying path. With two ohmic resistance elements independent of the magnetic field, the series-connected sensor elements form a Wheatstone bridge circuit. An output voltage measured in its dead arm is dependent on an angular displacement of the bias field or the primary-current carrying paths. In accordance with the doctrine of this specification, therefore, an arrangement of the sensor elements with primary-current carrying paths running parallel with each other but bias fields opposed to one another is recommended, wherein, in particular, the sensor elements are arranged at a distance from each other.

In a preferred development of the magnetoresistive sensor in accordance with the invention, the resistance values of the ohmic resistance elements in two bridge arms with characteristics selected to be at least essentially matching with each other are at least essentially constant over the magnetic field strength of the magnetic field to which the ohmic resistance elements are exposed. The Wheatstone bridge configuration is thereby formed with two bridge arms that are influenced by the magnetic field and two that are independent of the magnetic field. The bridge arms that are independent of the magnetic field may preferably be designed with fixed resistors.

In a further advantageous development of the invention, the ohmic resistance elements with resistance values that are at least essentially constant over the magnetic field strength of the magnetic field to which the ohmic resistance elements are exposed are designed with a magnetic screening. All resistance elements can then be produced in the same manufacturing step with at least virtually identical dimensioning, as a result of which their manufacture is simple and precise. The resistance elements that are to exhibit at least essentially constant resistance values are additionally magnetically screened in order that a magnetic field to which the sensor is exposed cannot exert any influence on these resistance elements.

The sensor in accordance with the invention can preferably be used in a motion and/or speed measurement device with a magnetized encoder which is equipped with a zone with magnetic north and south poles arranged alternately along a direction of motion. This motion and/or speed measurement device is advantageously equipped with a frequency evaluation device, which is coupled at one input with the signal output terminals of the Wheatstone bridge configuration and, at one output, emits a signal which constitutes a measure of the frequency of a signal emitted by the magnetoresistive sensor.

The invention will be further described with reference to examples of embodiments shown in the drawings, to which, however, the invention is not restricted.

Figure 4:
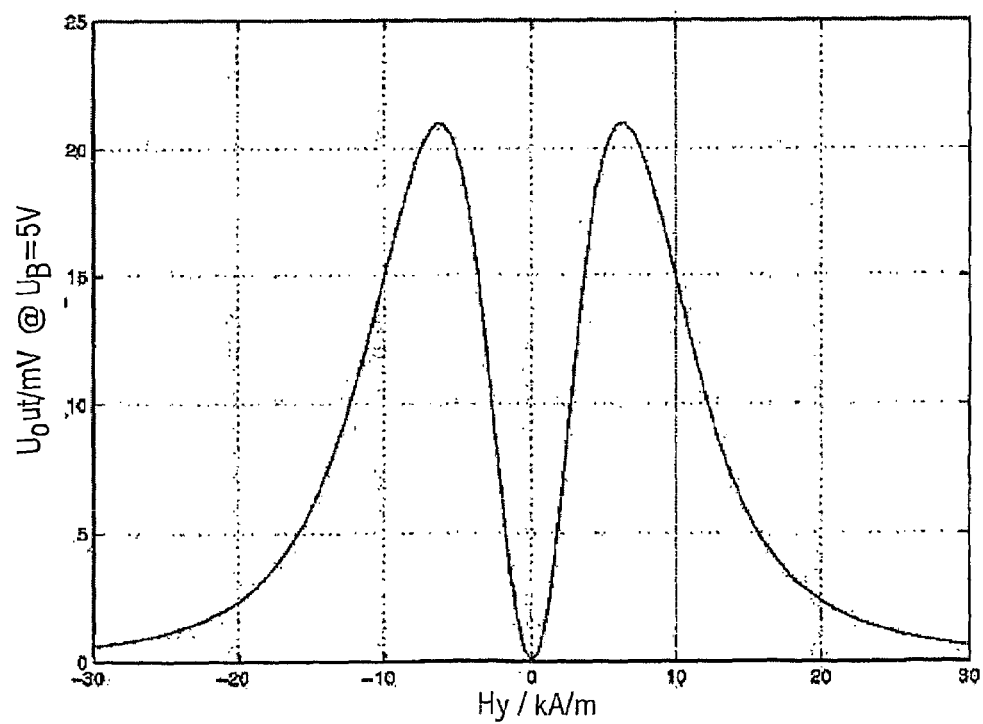

FIG. 4 shows an output characteristic of the Wheatstone bridge configuration of one embodiment example of the magnetoresistive sensor in accordance with the invention as a function of an output voltage measured over the signal output terminals of the Wheatstone bridge configuration as a function of the magnetic field strength of a magnetic field to which the Wheatstone bridge configuration is exposed.

Figure 5:
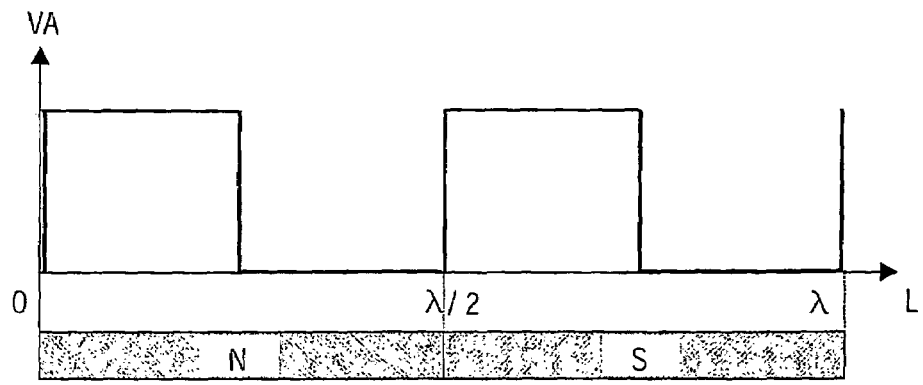

FIG. 5 shows an example of an output voltage measured over the signal output terminals of the Wheatstone bridge configuration following comparison with a switching threshold.

Figure 6:
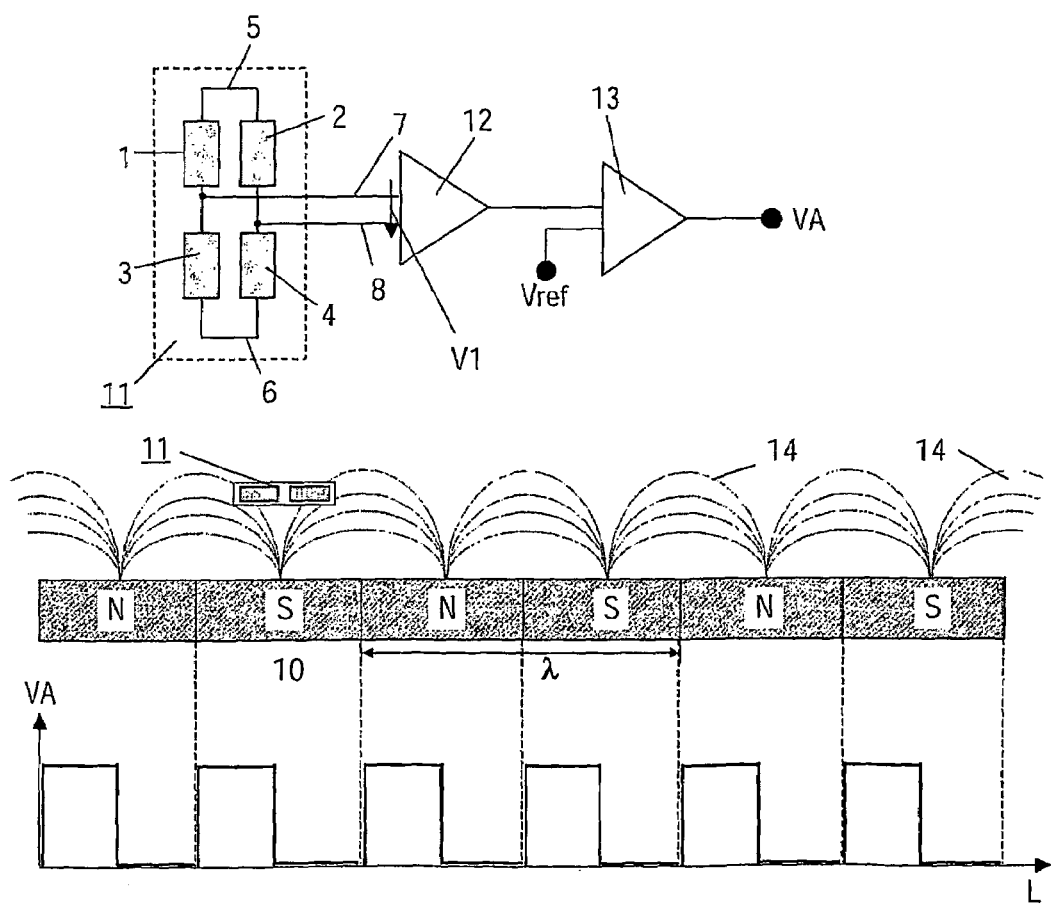

FIG. 6 shows one embodiment of a motion and/or speed measurement device with a linear magnetized encoder as a first application example of a magnetoresistive sensor in accordance with the invention.

Figure 7:
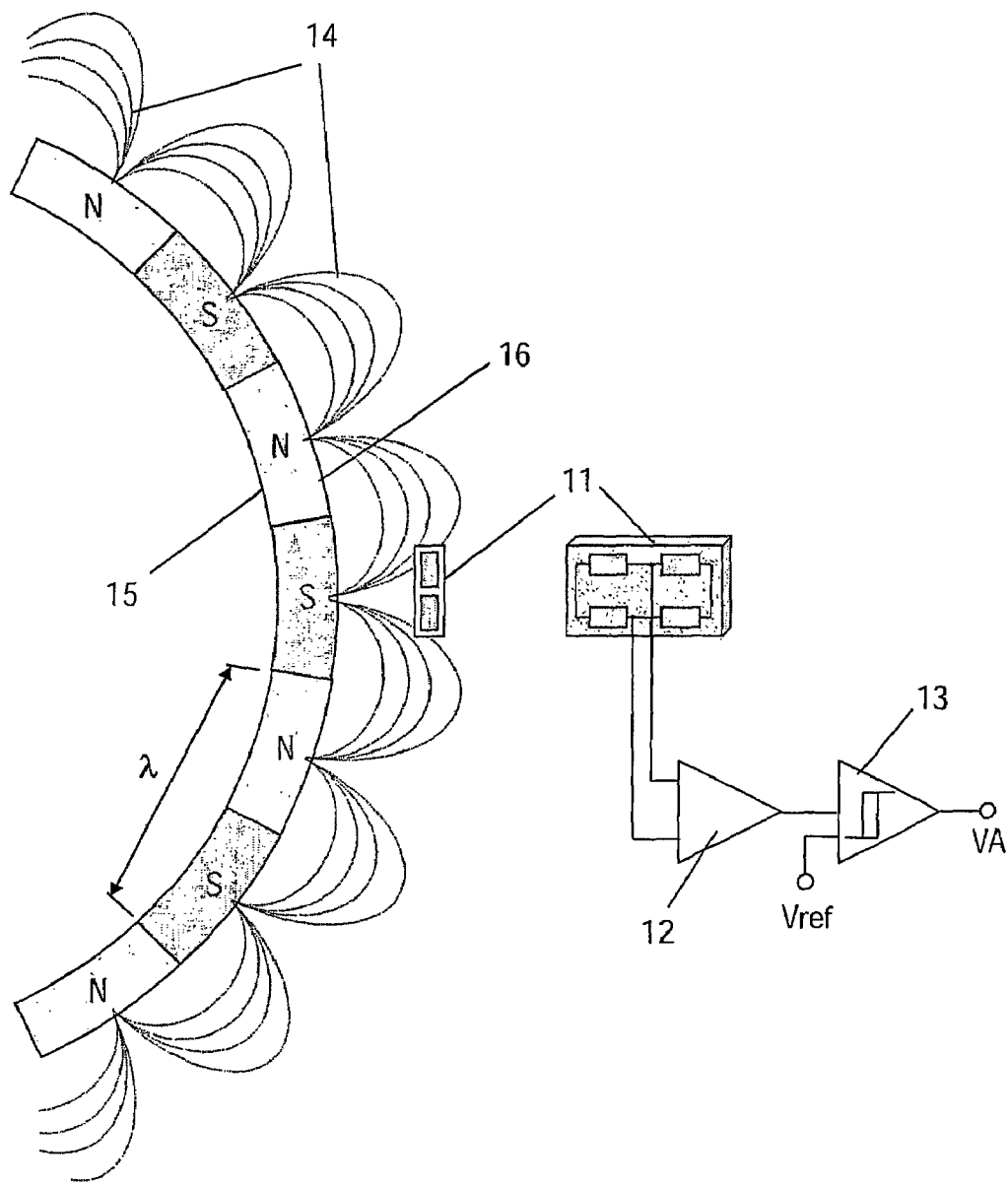

FIG. 7 shows one embodiment of a motion and/or speed measurement device with a rotationally symmetrical magnetized encoder as a second application example of a magnetoresistive sensor in accordance with the invention, with the sensor arranged at the periphery of the encoder above its lateral surface.

Figure 8:
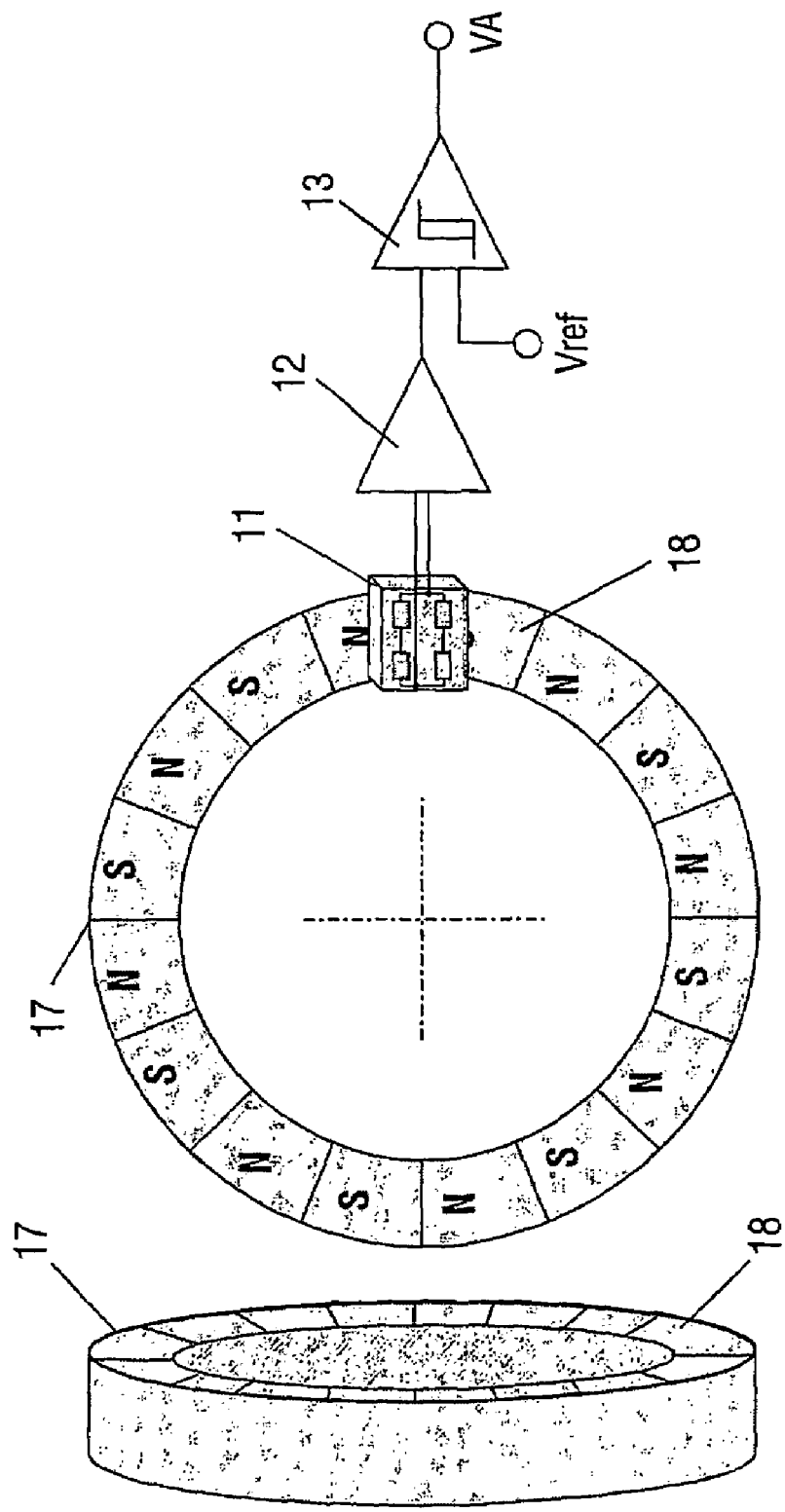

FIG. 8 shows one embodiment of a motion and/or speed measurement device with a modification of a rotationally symmetrical magnetized encoder as a third application example of a magnetoresistive sensor in accordance with the invention, with the sensor arranged at the periphery of the encoder above its end face.

Figure 1:
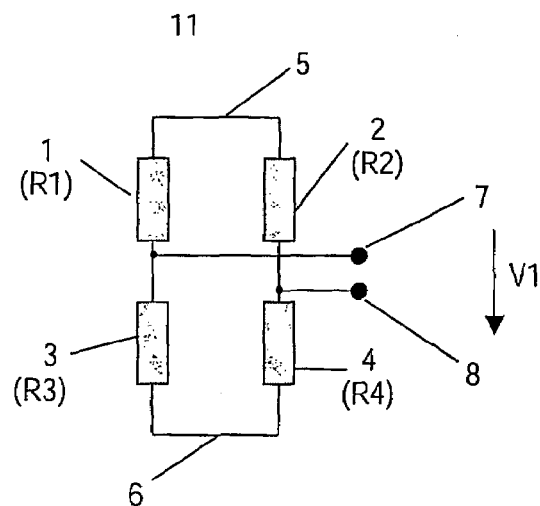
FIG. 1 shows the schematic circuit diagram of an example of a magnetoresistive sensor in accordance with the invention in a Wheatstone bridge configuration.

Magnetoresistive sensors, designated simply as "sensors" below for the sake of simplicity, preferably take the form of at least one Wheatstone bridge configuration, whose bridge arms are designed with resistance elements. One example of an arrangement of this kind is shown in FIG. 1. In this sensor, labeled with reference 11, the individual resistance elements are labeled with references 1, 2, 3 and 4 in the first, second, third and fourth bridge arms respectively. The individual resistance elements are preferably produced from a ferromagnetic material, e.g. permalloy, which represents a compound of inter alia nickel and iron. The material is preferably laid in strips in order to achieve, through the resultant strip length, a defined resistance value Ri of the individual resistance element i=1, 2, 3 and 4 respectively.

The Wheatstone bridge configuration in accordance with FIG. 1 is further equipped with a first and a second supply terminal, 5 and 6 respectively, to which a supply voltage is fed during operation. The output signal of the Wheatstone bridge configuration designated with reference V1 in FIG. 1 is tapped off between a first and a second signal output terminal, 7 and 8 respectively.

Under the influence of an external magnetic field—to be measured by the sensor—with a magnetic field strength H, the resistance elements i alter their resistance values Ri, and the resultant output signal V1 of the Wheatstone bridge configuration is a function of this magnetic field strength H. The resistance value Ri of a resistance element i of this kind hereby changes, in particular, in accordance with a quadratic function. Owing to the quadratic dependence, the characteristic between the resistance value Ri of a resistance element i of this kind and the magnetic field strength H is dependent on the amount, but independent of the sign of the field strength H.

For applications in which no linear characteristic is required, the magnetoresistive resistance elements with non-linear or quadratic characteristics may be used. This includes speed measurement with active (e.g. magnetized wheels) or passive encoders (e.g. ferromagnetic toothed wheels). For e.g. a speed measurement, only the measurement of, for example, the zero transitions of the output signal of a sensor of this kind is necessary, which can be realized relatively easily with a comparator arrangement downstream of the sensor.

In the case of active encoders (e.g. magnetized rotors) the value of magnetic field strength H can be measured depending on the distance between sensor and encoder, wherein the distance is represented as the amplitude level of the output signal. The magnetized encoders may be equipped with e.g. a laterally alternately magnetized layer (alternating magnetic north/south poles).

In the case of a relative motion of the magnetized encoder to a conventional sensor without frequency doubling, a periodic output signal is generated, which, in the case of a motion over a pair comprising a north and a south pole of the magnetized layer each arranged adjacent to one another, has only a signal period. The output signals may hereby assume different signal waveforms, e.g. triangular, square-wave, sinusoidal etc., with corresponding zero transitions. A pair of the said type, designated a pole pair, has a pole pair width of $\lambda$.

For speed measurement using conventional methods with speed sensors, the boundaries between the magnetic north and south poles, for example, are used for zero transition recognition. Used hereby are signal processing configurations with simple comparator circuits, which generate binary signals from the continuous output signals of the sensors, which binary signals can be processed by an evaluation unit further downstream. One application example is that of speed measurement for braking systems in automobiles with anti-skid systems. With a known number of magnetic north and south poles on the encoder user, the speed can be determined using a counter circuit. In conventional methods, therefore, the frequency of the said binary signals corresponds to the number of pole pairs of the encoder.

For future applications of magnetoresistive sensors, however, an elevation of the resolution of the sensor output signals over the motion coordinate of the encoder is advantageous. Particularly for the use of encoders with reduced dimensions and for an elevation of the frequency of the output signals, it is preferable if the sensor already makes directly available an output signal with doubled frequency. This applies in particular to application cases with more stringent requirements regarding operational reliability, including in cases of defect, e.g. in the automotive sector.

Furthermore, a sensor should, preferably, be capable of universal application in different application cases. In particular, the necessity of structural matching of the sensor to the particular encoder used in different application cases should be avoided.

In the sensor in accordance with the invention, which fulfils these requirements in a simple manner, and is preferably designed as shown in FIG. 1 with a Wheatstone bridge configuration with four bridge arms, the output signal V1 is determined in accordance with the following formula:

$$V1=(R1/(R1+R3))-(R2/(R2+R4)).$$

If four resistance elements with identical dependence on the field strength H of an external magnetic field that is at least largely homogeneous in the vicinity of the sensor are used in the four bridge arms, then, although changes in the individual resistance values Ri arise as a result of the influence of this external magnetic field, these are at least virtually identical, and therefore bring about no change in the output signal V1. This output signal V1 is therefore not a function of the field strength H.

In order to achieve a different change in the resistance values Ri of the individual resistance elements i=1, 2, 3, 4 with the field strength, then, in accordance with a first embodiment example of the invention, used in two bridge arms of the Wheatstone bridge configuration—e.g. in the second and third bridge arm—are resistance elements 2, 3 with a constant resistance value (R2=const.; R3=const.)— also designated fixed resistors below. Through the influence of the external magnetic field of field strength H, resistance changes of the magnetoresistive resistance elements 1, 4 arise in the other two bridge arms—the first and fourth in this case—whereas the fixed resistors retain their value.

Figure 2:
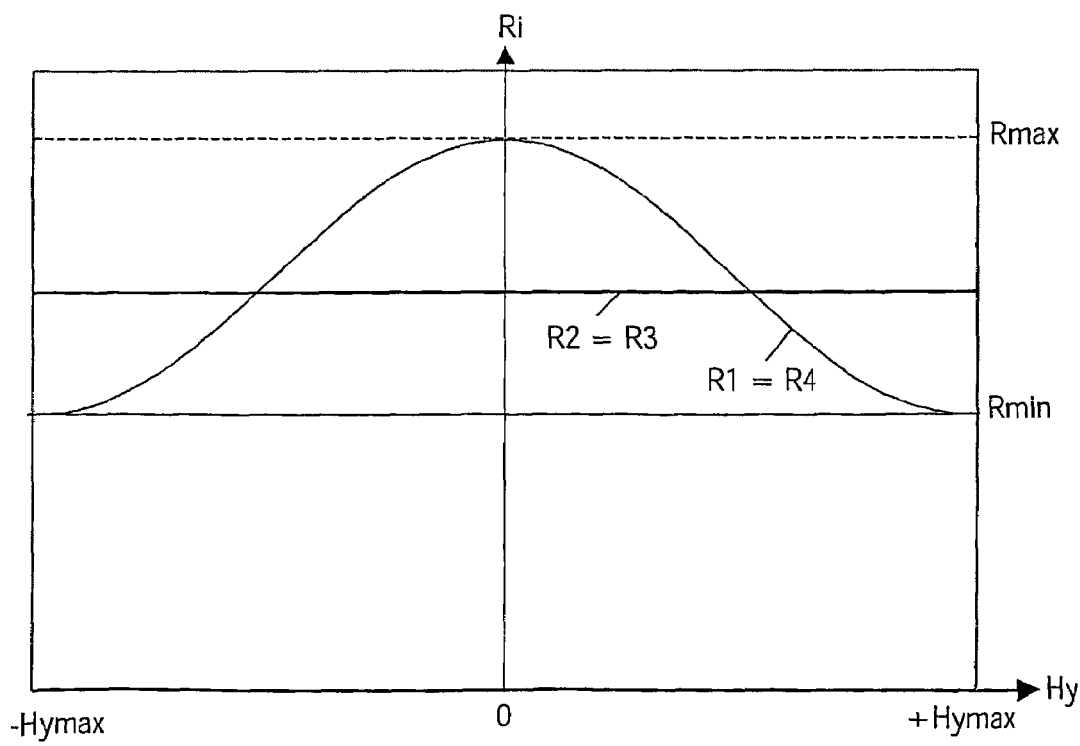
FIG. 2 shows characteristics of the ohmic resistance elements of one embodiment example of the magnetoresistive sensor in accordance with the invention to show the dependence of the resistance value of the ohmic resistance elements on the magnetic field strength of a magnetic field to which the ohmic resistance elements are exposed.

FIG. 2 shows examples of the forms of characteristics of this kind for the change in resistance values Ri with the field strength Hy of an external field. Whereas the fixed resistors 2, 3 retain their resistance values R2=R3=const., which have here been selected to correspond, over the entire value range of the field strength Hy of +Hymax to −Hymax, the resistance values R1=R4, which are here also selected to correspond, change over the entire value range of the field strength Hy of +Hymax to −Hymax between the boundary values Rmax at Hy=0 and Rmin at Hy=+Hymax and −Hymax. This characteristic Ri(Hy) preferably exhibits, at least in a value range around Hy=0, an at least virtually quadratic form.

With a selection of this kind of the resistance values Ri, an output signal V1 is obtained between the first and second signal output terminals 7 and 8, which output signal also has a non-linear dependence on the field strength Hy. If a sensor designed in the manner described is used above a magnetized encoder, an output signal V1 having a doubled frequency compared with the above-described, conventional speed sensors is generated. Through the evaluation of the sensor signal using a simple comparator circuit, a binary signal can be obtained here too.

The fixed resistors can be designed in a simple manner with materials whose resistance properties are independent of the magnetic field. In a modification of this embodiment example, the fixed resistors are designed with magnetoresistive resistance elements, which, however, are withdrawn from the influence of the external magnetic field through an additionally applied magnetic screening. Here again, a doubling of the output signal frequency is achieved compared with the conventional sensors described.

The resistance values Ri of the resistance elements i=1, 2, 3, 4 depend on the selection of the material composition and the spatial design, and can be adjusted by altering these. This also applies to the achieved dependencies of the resistance values Ri on the field strength H. A material constant, designated a characteristic field strength H0, is used to describe the materials properties of the resistance elements i=1, 2, 3, 4, , which material constant is derived in accordance with the relationships below as:

$$H0=Hk+Hd, \text{ with } Hk=2*k/M \text{ and } Hd=-N*M$$

wherein:

Hk is the anisotropy field strength of the material, which is determined by the material to be used and the manufacturing processes, Hd is the demagnetization field strength Hd (also known as form anisotropy), which is determined by the geometric extensions of the material, k is a material constant, N is a demagnetization factor, M is an internal magnetization of the material.

In a second embodiment example of the sensor in accordance with the invention, these properties are used to the effect that, through appropriate shaping of the resistance elements formed by strips of the said material—i.e. their height, width, etc—different characteristic field strengths H0, and thereby non-linear characteristics with different forms, can be generated for the individual resistance elements.

Figure 3:
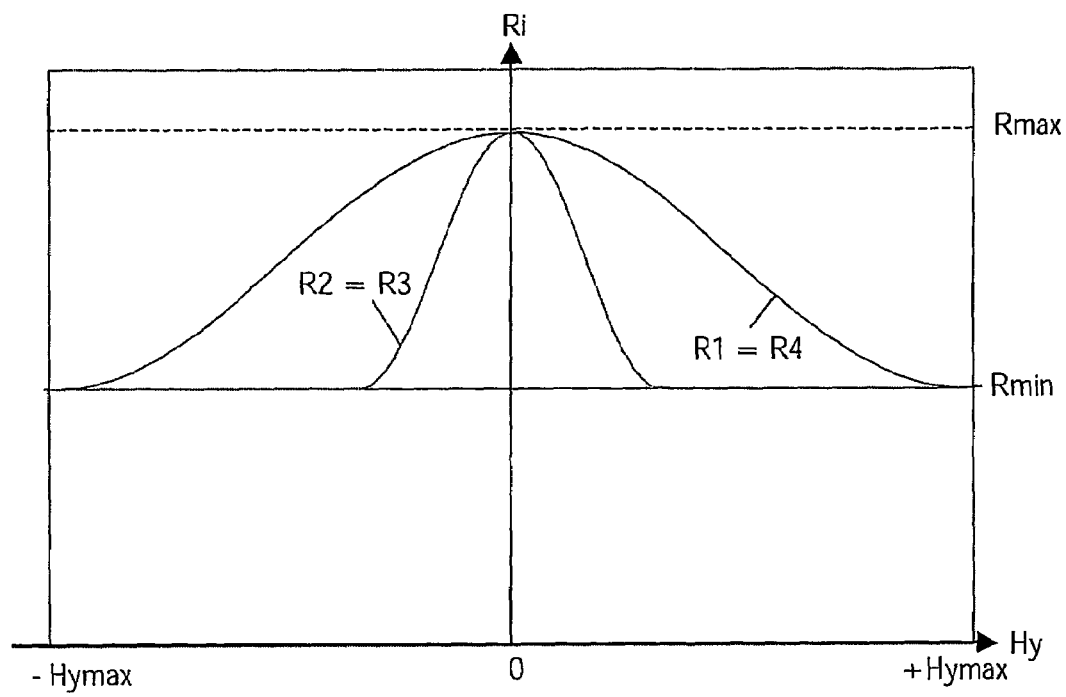
FIG. 3 shows characteristics of the ohmic resistance elements of a further embodiment example of the magnetoresistive sensor in accordance with the invention to show the dependence of the resistance value of the ohmic resistance elements on the magnetic field strength of a magnetic field to which the ohmic resistance elements are exposed.

An example of this is shown in FIG. 3, which otherwise corresponds to FIG. 2 in its plot. Compared with the embodiment example shown in FIG. 2, the resistance values R1, R4 of the resistance elements 1 and 4 are unchanged, whereas a dependence on the field strength Hy is selected for resistance elements 2, 3 in the manner shown, in which the resistance values R2, R3 vary more strongly with field strength Hy than the resistance values R1, R4.

FIG. 4 shows an example of a measurement curve for an output characteristic of the Wheatstone bridge configuration of the embodiment example described in FIG. 3 as a function of the output signal V1 measured above the signal output terminals 7, 8 of the Wheatstone bridge configuration as a function of the magnetic field strength Hy of a magnetic field to which the Wheatstone bridge configuration is exposed. In the plot in this diagram, however, the output signal V1 is plotted as an output voltage in mV and designated $U_o$ut. The unit of measurement for the field strength Hy is kA/m. The supply voltage applied during operation between the first and second supply terminals 5 and 6 respectively of the Wheatstone bridge configuration is designated $U_B$ in FIG. 4, and has a value of 5V for the measurement curve shown.

A comparable curve is also obtained for a sensor dimensioned in accordance with FIG. 2.

With an external magnetic field which operates on a sensor described by a characteristic of the type shown in FIG. 4, if the field strength Hy passes through a cycle of e.g. Hy=0 via Hy=Hymax, Hy=0, Hy=−Hymax and back to Hy=0, it is apparent from the diagram in FIG. 4 that, during this pass, the output signal V1 or the output voltage Uout passes through two cycles of its variation between the lowest and highest value. At the signal output terminals 7, 8 of the Wheatstone bridge configuration, an output signal V1 thereby arises, which shows a doubling of the frequency as compared with the variation in field strength Hy caused by the motion in relation to the pole pairs of the encoder.

FIG. 5 shows an example of the form of a binary signal VA, which has been obtained from the continuity of the output signal V1 by comparison with a switching threshold Vref in a manner that is known per se. For comparison purposes, the position of the pole pair N–S of the encoder is sketched schematically below the binary signal VA, and the dimensions of the poles N and S of the encoder along its motion coordinates L are entered using the pole pair width 1 and half the pole pair width ½. Two periods of the binary signal VA correspond to the motion between sensor and encoder along motion coordinate L around a pole pair width 1.

The frequency-doubling property of the magnetoresistive sensor in accordance with the invention fosters, in an advantageous manner, its use in the most diverse applications for speed and position measurement (motion and/or speed measurement) with magnetized encoders. The encoders may hereby be used as e.g. a linear scale for linear displacement measurement or as a rotor for speed measurement. The application examples described below with reference to FIGS. 6 to 8 may also be used with different embodiments of the encoder, with appropriate further processing of the output signals, for position finding.

FIG. 6 shows an embodiment of a motion and/or speed measurement device with a linear magnetized encoder 10 as a first application example of a magnetoresistive sensor 11 in accordance with the invention. Elements already described are again provided with identical references. In accordance with the block circuit diagram shown in the upper part of FIG. 6, the sensor 11 is connected via its signal output terminals 7 and 8 to input terminals of a differential amplifier 12, which serves to amplify the output signal V1 emitted by the sensor 11. For further processing of the amplified output signal, the differential amplifier 12 is connected at its output terminal to a first input terminal of a comparator 13, to which a voltage Vref is fed via a second input terminal. The voltage Vref forms a switching threshold with which the continuity of the (amplified) output signal V1 is compared in order to obtain a binary signal VA at the output of the comparator 13.

Shown schematically in the central part of FIG. 6 is the arrangement of the magnetic north poles N and south poles S of the magnetized encoder 10. The form of the magnetic field lines 14 between the poles N and S is indicated. Each polar pair of one north and one south pole N, S has a pole pair width λ—measured along the motion coordinate L of the encoder 10. The sensor 11 is aligned with its longest side plane-parallel with the surface of the encoder 10.

Plotted in the lower part of FIG. 6 is the form of the binary signal VA over the motion coordinate L of the encoder 10, which corresponds with that of FIG. 5.

FIG. 7 shows an embodiment of a motion and/or speed measurement device with a rotationally symmetrical magnetized encoder 15 as the second application example of a magnetoresistive sensor 11 in accordance with the invention, with the sensor 11 arranged at the periphery of the encoder 15 above its lateral surface 16. Here again, the sensor 11 is aligned with its longest side plane-parallel with the lateral surface 16 of the encoder 15. Otherwise, the arrangement corresponds with that in accordance with FIG. 6.

FIG. 8 shows an embodiment of a motion and/or speed measurement device with a modification of a rotationally symmetrical magnetized encoder 17 as the third application example of a magnetoresistive sensor 11 in accordance with the invention, with the sensor 11 arranged at the periphery of the encoder 17 above its end face 18. The sensor 11 is aligned with its longest side plane-parallel with the end face 18 of the encoder 17. Otherwise, the arrangement corresponds with those in accordance with FIGS. 6 and 7.

The sensor in accordance with the invention and the motion and/or speed measurement device in accordance with the invention are of a more compact, simpler design compared with the arrangement shown in WO 00/29815. It is thereby advantageously possible to comply more successfully with a desired reduction in the dimensions of components, in particular in automotive applications, e.g. the scaling-down of wheel bearings, and the associated requirement for savings in terms of weight and costs.

As a result of the reduction in dimensions of the said components in the automotive sector, it is also essential to scale down the magnetized encoders used in this field. With conventional speed sensors, although the other properties of the encoder remain the same, the scaling-down of the encoder leads to a drastic reduction in the magnetic field strength of the external field impressed on the sensor by the encoder. The consequences of this include a restriction in the useable air gap between encoder and sensor for the same number of magnetic poles. If, in order to retain the useable air gap, the magnetic properties of the magnetization of the encoder are improved, e.g. by a stronger magnetic material, or the geometric circumstances are changed, e.g. by a reduction in the number of magnetic poles on the encoder, this will be offset by a lower resolution of the output signal, which, particularly at low encoder speeds, may lead to impairment of the measurement results. In order to avoid this, it is recommended that a frequency-doubling sensor configuration be used.

In addition to the use of signal processing stages downstream of the sensor to generate binary signals with a frequency higher than the frequency of the sensor's output signal and the complexity associated with this, it is simpler and more operationally reliable to execute a frequency doubling within the sensor. The magnetoresistive sensor with non-linear characteristic enables the frequency of the binary signal to be doubled as compared with conventional speed sensors. Furthermore, the magnetoresistive sensor with non-linear characteristic offers the advantage of an application that is independent of the dimensions of the particular encoder used, i.e. for magnetized encoders with different pole pair widths λ, only one sensor design is required. The costs of producing different sensor designs for encoders with different pole pair widths therefore do not apply.

As a result of the frequency multiplication, advantages also arise for position measurements on magnetized encoders. This includes, for example, the reduction in circuit complexity for the electronic evaluation circuit in the use of interpolation methods. Using the frequency doubling, the interpolation factor can be reduced. This implies a smaller space requirement in respect of the complexity of electronic components, and a significant cost reduction.

Owing to the non-linear or, in particular, quadratic characteristic of the sensor, at least over sections, there is no risk of "flipping", i.e. the reverse of the characteristic on a direction change in the external magnetic field, which may be present in the case of linearized characteristics. In order to prevent this "flipping" by external magnetic fields, an auxiliary magnet is preferably attached to the sensor in the known configurations. In the case of the sensor in accordance with the invention, an auxiliary magnet of this kind is not required. Mounting space and costs can thereby be reduced.

Compared with sensors with orthogonal arrangement in relation to the magnetized encoder, as is generally the case with angle sensors, for example, the sensor with a non-linear characteristic in accordance with the invention offers the advantage of plane-parallel arrangement in relation to the surface of the magnetized encoder. This gives rise to the opportunity to achieve a favorable mounting position of the sensor in relation to the encoder, in which the high magnetic field strengths of the encoder can be exploited.

The invention claimed is:

1. A magnetoresistive sensor for operation with a magnetized encoder that is equipped with a zone with magnetic north and south poles arranged alternately along a direction of motion, the sensor comprising
    a Wheatstone bridge configuration with
        a first bridge arm between a first supply terminal and a first signal output terminal of the Wheatstone bridge configuration,
        a second bridge arm between the first supply terminal and a second signal output terminal of the Wheatstone bridge configuration,
        a third bridge arm between a second supply terminal and the first signal output terminal of the Wheatstone bridge configuration, and
        a fourth bridge arm between the second supply terminal and the second signal output terminal of the Wheatstone bridge configuration,
    wherein each of the bridge arms includes an ohmic resistance element with a resistance-value dependence on the magnetic field strength of a magnetic field influencing the ohmic resistance element in accordance with a defined characteristic, the resistance-values of each of the ohmic resistance elements varying in phase with one another, characterized in that the characteristics of the ohmic resistance elements in the first and fourth bridge arms are selected to be at least essentially matching with each other and significantly different from the characteristics, selected to be at least essentially matching with each other, of the ohmic resistance elements in the second and third bridge arms.

2. A motion and/or speed measurement device comprising:
    a magnetized encoder that is equipped with a zone with magnetic north and south poles arranged alternately along a direction of motion, and
    a magnetoresistive sensor as claimed in claim 1.

3. A motion and/or speed measurement device as claimed in claim 2, further comprising a frequency evaluation device that is coupled at one input with the signal output terminals of the Wheatstone bridge configuration and that, at one output, emits a signal which constitutes a measure of the frequency of a signal emitted by the magnetoresistive sensor.

4. A magnetoresistive sensor as claimed in claim 1, wherein the resistance-values of each of the ohmic resistance elements have maximum values that are equal to one another.

5. A magnetoresistive sensor as claimed in claim 1, wherein, in response to a change in the magnetic field strength, the resistance-values of the ohmic resistance elements in the first and fourth bridge arms change at a rate that is different than a rate at which the resistance-values of the ohmic resistance elements in the second and third bridge arms change.

6. A magnetoresistive sensor as claimed in claim 1, wherein, in response to a change in the magnetic field strength, the resistance-values of the ohmic resistance elements in the first and fourth bridge arms change at a rate that is different than a rate at which the resistance-values of the ohmic resistance elements in the second and third bridge arms change, where the rates are set to produce a frequency at the first and second signal output terminals that is double a frequency produced by one of the rates of change.

* * * * *